(12) United States Patent
Paraschou et al.

(10) Patent No.: US 10,944,368 B2
(45) Date of Patent: Mar. 9, 2021

(54) OFFSET CORRECTION FOR PSEUDO DIFFERENTIAL SIGNALING

(71) Applicant: Advanced Micro Devices, Inc., Santa Clara, CA (US)

(72) Inventors: Milam Paraschou, Dellwood, MN (US); Jeffrey Cooper, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/289,247

(22) Filed: Feb. 28, 2019

(65) Prior Publication Data

US 2020/0280290 A1   Sep. 3, 2020

(51) Int. Cl.
*H03F 3/45* (2006.01)

(52) U.S. Cl.
CPC ..... *H03F 3/45968* (2013.01); *H03F 3/45475* (2013.01)

(58) Field of Classification Search
CPC ..................................................... H03F 3/459
USPC ......................................................... 330/258
See application file for complete search history.

(56) References Cited

U.S. PATENT DOCUMENTS

| | | | |
|---|---|---|---|
| 3,795,901 A | 3/1974 | Boehm et al. | |
| 4,689,620 A | 8/1987 | Wondrak | |
| 5,610,414 A | 3/1997 | Yoneda et al. | |
| 5,694,427 A | 12/1997 | Wincn | |
| 5,963,484 A | 10/1999 | Jung | |
| 6,504,420 B1 | 1/2003 | Vorenkamp et al. | |
| 6,720,804 B2 | 4/2004 | Taguchi et al. | |
| 6,937,111 B2 | 8/2005 | Kwon | |
| 6,944,071 B2 | 9/2005 | Martin | |
| 6,972,607 B1 | 12/2005 | Chen et al. | |
| 6,992,501 B2 | 1/2006 | Rapport | |
| 6,992,611 B1* | 1/2006 | Lili ..................... | H03M 1/0607 341/120 |
| 7,034,565 B2 | 4/2006 | Lee | |
| 7,095,217 B1 | 8/2006 | Niculae et al. | |
| 7,099,395 B1 | 8/2006 | Sidiropoulos et al. | |
| 8,164,362 B2 | 4/2012 | Afghahi et al. | |
| 8,344,808 B2 | 1/2013 | Samavedam et al. | |
| 8,710,810 B1 | 4/2014 | McJimsey et al. | |
| 10,530,325 B1 | 1/2020 | Gonzales et al. | |

(Continued)

OTHER PUBLICATIONS

Non-Final Office Action in U.S. Appl. No. 16/140,356, dated Jul. 12, 2019, 9 pages.

(Continued)

*Primary Examiner* — Patricia T Nguyen
(74) *Attorney, Agent, or Firm* — Kowert Hood Munyon Rankin and Goetzel PC; Rory D. Rankin

(57) ABSTRACT

Systems, apparatuses, and methods for performing offset correction for pseudo differential signaling are disclosed. An apparatus includes at least a sense amplifier and an offset correction circuit. The offset correction circuit generates an offset correction voltage by applying a positive or negative offset to a termination voltage. The offset correction circuit supplies the offset correction voltage to a negative input terminal of the sense amplifier. An input signal voltage is supplied to the positive input terminal of the sense amplifier. The sense amplifier generates an output based on a comparison of the voltages supplied to the positive and negative input terminals.

17 Claims, 7 Drawing Sheets

(56) References Cited

U.S. PATENT DOCUMENTS

| | | |
|---|---|---|
| 10,692,545 B2 | 6/2020 | Paraschou et al. |
| 10,749,552 B2 | 8/2020 | Singh et al. |
| 2002/0084927 A1* | 7/2002 | Krymski ............. H03M 1/1014 341/155 |
| 2003/0012065 A1* | 1/2003 | Chang .................. H04L 25/061 365/200 |
| 2003/0234674 A1 | 12/2003 | Morgan |
| 2004/0264230 A1 | 12/2004 | Brand et al. |
| 2006/0117155 A1 | 6/2006 | Ware et al. |
| 2008/0029824 A1 | 2/2008 | Baizley et al. |
| 2009/0167432 A1* | 7/2009 | van den Heuvel .... G01N 30/66 330/69 |
| 2009/0212771 A1* | 8/2009 | Cummings ........ G01R 33/0035 324/252 |
| 2009/0256587 A1 | 10/2009 | Kuboyama et al. |
| 2010/0164622 A1 | 7/2010 | Ge et al. |
| 2012/0197568 A1 | 8/2012 | Souma |
| 2014/0140419 A1 | 5/2014 | Poulton et al. |
| 2015/0002189 A1 | 1/2015 | Dietl et al. |
| 2015/0236648 A1* | 8/2015 | Ahmad ............... H03F 3/45977 330/84 |
| 2017/0169868 A1 | 6/2017 | Huang et al. |
| 2017/0288434 A1 | 10/2017 | Narita |

OTHER PUBLICATIONS

Non-Final Office Action in U.S. Appl. No. 16/118,054, dated Apr. 30, 2019, 12 pages.

Tyan, Eer-Wen, U.S. Appl. No. 11/147,002, entitled "Low power termination circuit", filed Jun. 7, 2005, 15 pages.

Notice of Allowance in in U.S. Appl. No. 16/118,054, dated Aug. 21, 2019, 10 pages.

Final Office Action in U.S. Appl. No. 16/140,356, dated Oct. 24, 2019, 9 pages.

International Search Report and Written Opinion in International Application No. PCT/US2019/039395, dated Sep. 30, 2019, 13 pages.

\* cited by examiner

OFFSET CORRECTION FOR PSEUDO DIFFERENTIAL SIGNALING

BACKGROUND

Description of the Related Art

Modern semiconductor chips include a variety of circuits and components to facilitate fast and efficient computation. When transferring information between functional blocks in a semiconductor chip, electrical signals are typically sent on metal traces. Transmitters in a first functional block send the electrical signals across the metal traces. Receivers in a second functional block receive the electrical signals. In some cases, the two functional blocks are within a same die. In other cases, the two functional blocks are on separate dies. In either case, the metal traces have transmission line effects such as distributed inductance, capacitance and resistance throughout their length. For modern integrated circuits, the interconnect capacitance reduces signal integrity and signal transfer rates more so than gate capacitance of semiconductor devices.

The interconnect capacitance per unit length includes both sidewall fringing capacitance and cross-coupling capacitance. For example, the electromagnetic fields for the metal traces conducting signals and the return current on the ground plane create electrical interference on neighboring metal traces and on adjacent devices. As the operating voltage continues to decrease to reduce power consumption, the signal swing used for Boolean logic decreases as well as the noise margin. In view of the above, efficient methods for receiving information as signals in a computing system are desired.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

Figure 1:
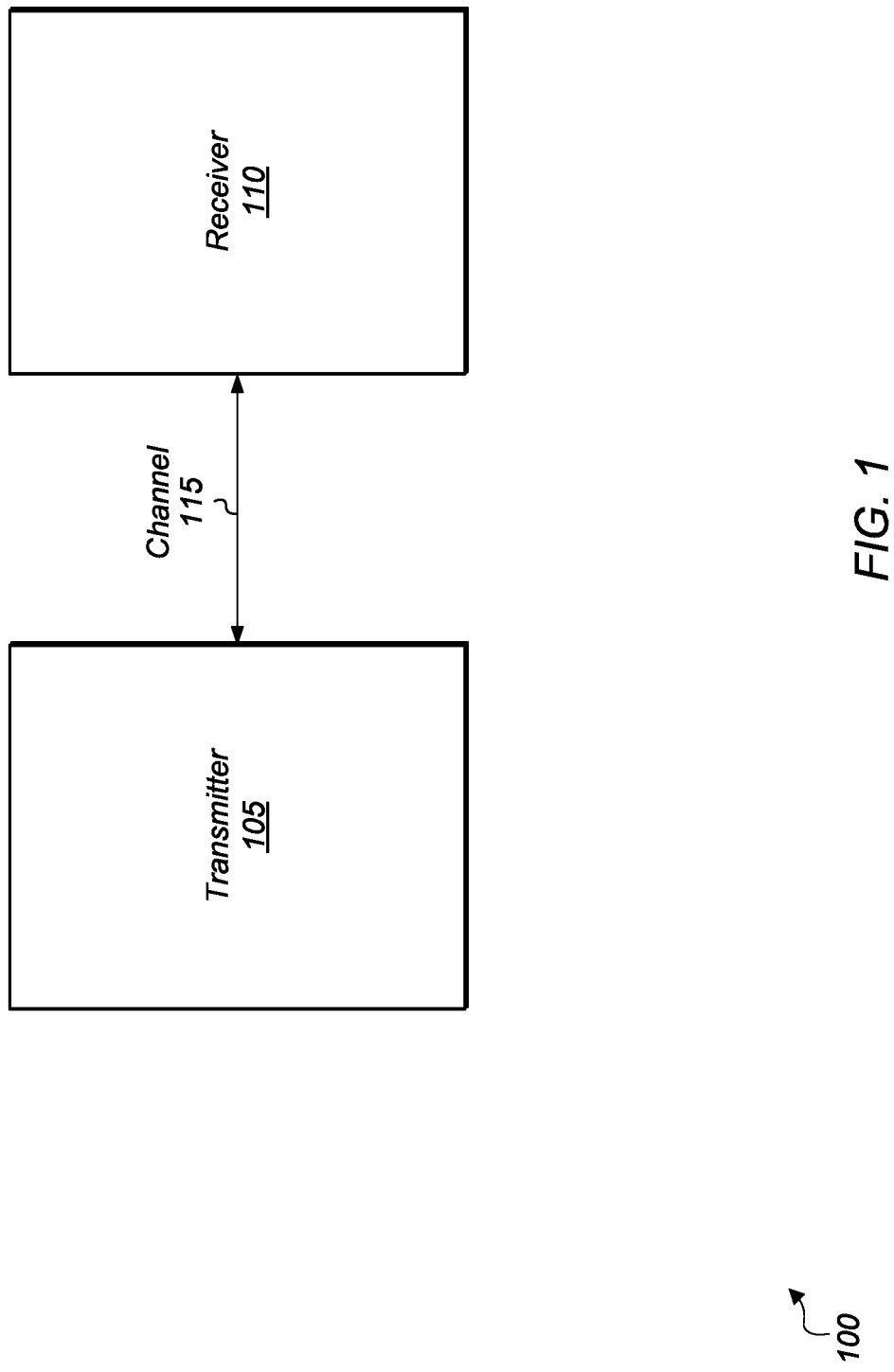
FIG. 1 is a block diagram of one implementation of generic computer or communication system including a transmitter and a receiver.

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for implementing offset correction techniques for use with pseudo differential signaling are disclosed. In various implementations, a computing system includes one or more functional blocks such as a general-purpose central processing unit (CPU), a graphics processing unit (GPU), an accelerated processing unit (APU), an input/output (I/O) device, a memory controller for system memory, and so forth. The computing system also includes multiple interfaces for transferring data between the functional blocks. In some cases, two functional blocks transferring data between one another are within a same semiconductor die. In other cases, the two functional blocks are on separate dies.

When transferring information between functional blocks, electrical signals are sent on metal traces. Transmitters in a first functional block send the electrical signals across the metal traces. Receivers in a second functional block receive the electrical signals. In one implementation, each receiver includes sampling circuitry for reconstructing the received input signal. The sampling circuitry receives the input signal and reconstructs the input signal by comparing the received input signal to a reference voltage. In various implementations, a termination voltage generator generates and sends a termination voltage to each receiver. In some implementations, each receiver uses the received termination voltage in the sampling circuitry. In various implementations, one or more sense amplifiers within the sampling circuitry receive the termination voltage on an input terminal used to receive a reference voltage. In one implementation, an offset correction circuit at the receiver applies a positive or negative offset to the termination voltage before passing the termination voltage through to the negative terminal of the sense amplifier. This ensures that the offset correction tracks the dynamic termination voltage.

In one implementation, an offset correction circuit receives the termination voltage and couples the termination voltage to the midpoint of a pair of resistors. In one implementation, the offset correction circuit includes a digital to analog converter (DAC). The offset correction circuit passes a current through the pair of resistors and connects a top end of a top resistor of the pair to a first input of a multiplexer. The signal coupled to the first input of the multiplexer represents the positive offset voltage applied to the termination voltage. The offset correction circuit connects a bottom of end of a bottom resistor of the pair to a second input of the multiplexer. The signal coupled to the second input of the multiplexer represents the negative offset voltage applied to the termination voltage. A select signal determines whether the termination voltage with the positive offset or the termination voltage with the negative offset is coupled through to the negative terminal of the sense amplifier.

Referring now to FIG. 1, a block diagram of one implementation of a generic computer or communication system 100 including a transmitter 105 and a receiver 110 is shown. In one implementation, transmitter 105 transmits data to receiver 110 over communication channel 115. Depending on the implementation, communication channel 115 is a cable, backplane, one or more metal traces, or other type of communication channel. For example, in one implementation, channel 115 is one or more metal traces between two chips of a multi-chip module. At the physical layer, the communication between the transmitter 105 and the receiver device 110 can be unidirectional or bidirectional according to a given transmission protocol. It is noted that system 100 can include any number and type of other devices. Additionally, system 100 can include any number of transmitter-receiver pairs dispersed throughout the system.

Transmitter 105 and receiver 110 can be any type of devices depending on the implementation. For example, in one implementation, transmitter 105 is a processing unit (e.g., central processing unit (CPU), graphics processing unit (GPU)) and receiver 110 is a memory device. The memory device can be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices can be coupled onto a circuit board to form memory modules such as single inline memory modules (SIMMs), dual inline memory modules (DIMMs), etc. Alternatively, the memory devices can be mounted within a system on chip (SoC) or integrated circuit (IC) in a chip-on-chip configuration, a package-on-package configuration, or a multi-chip module (MCM) configuration.

In another implementation, transmitter 105 is an input/output (I/O) fabric and receiver 110 is a peripheral device. The peripheral devices can include devices for various types of wireless communication, such as wifi, Bluetooth, cellular, global positioning system, etc. The peripheral devices can also include additional storage, including RAM storage, solid state storage, or disk storage. The peripheral devices can also include user interface devices such as a display screen, including touch display screens or multitouch display screens, keyboard or other input devices, microphones, speakers, etc. In other implementations, transmitter 105 and receiver 110 are other types of devices. It is noted that system 100 can be any type of system, such as an IC, SoC, MCM, and so on.

Figure 2:
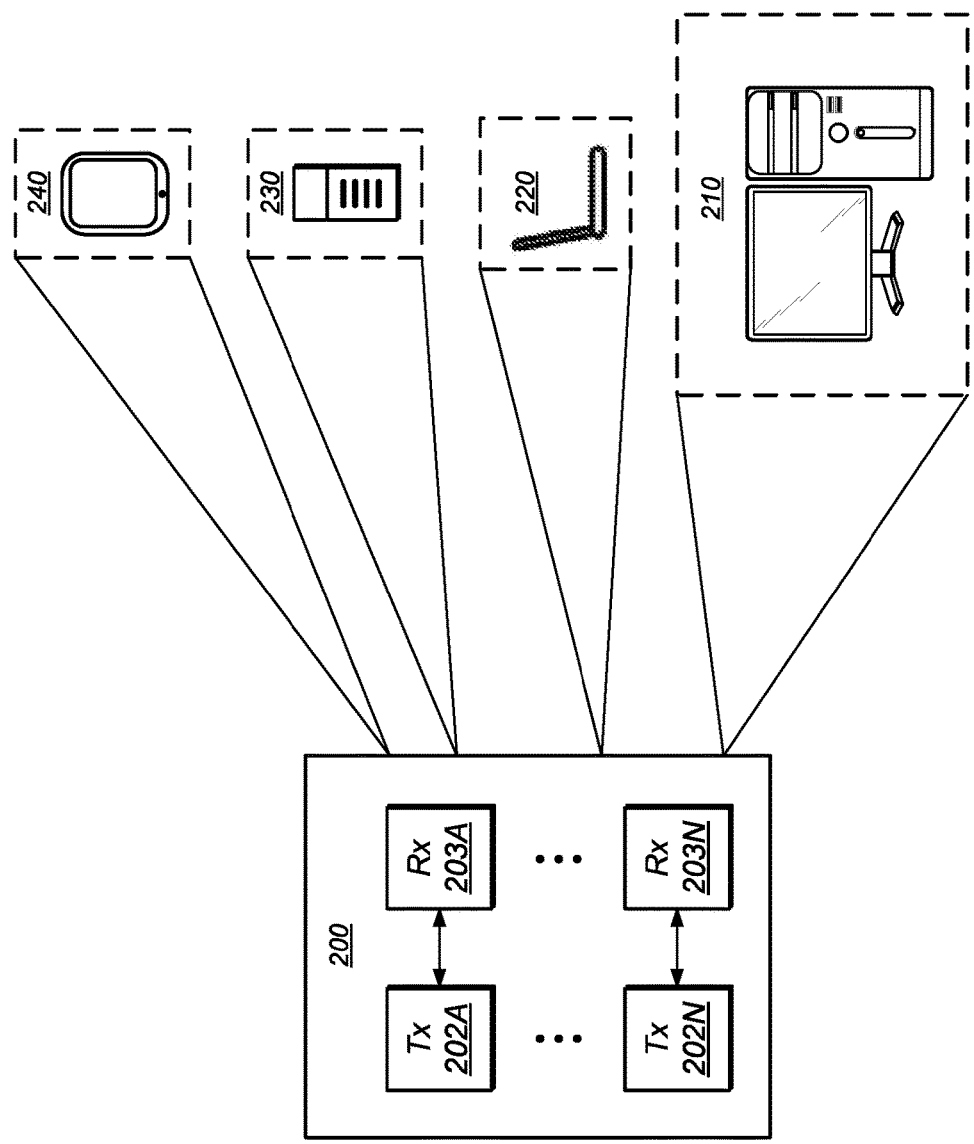
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes any number of pairs of transmitters 202A-N and receivers 203A-N.

Figure 3:
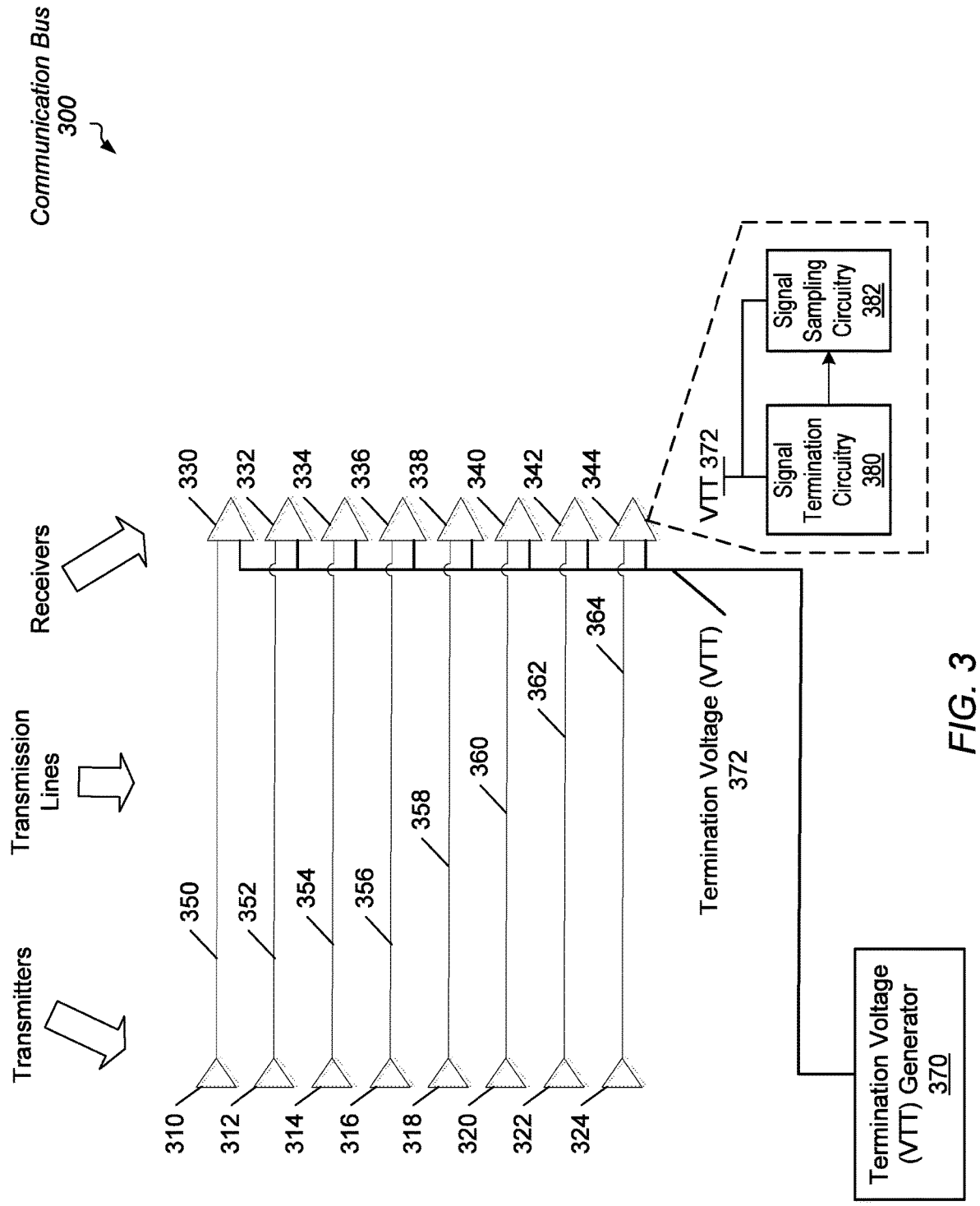
FIG. 3 is a generalized block diagram of one implementation of a communication bus.
Figure 5:
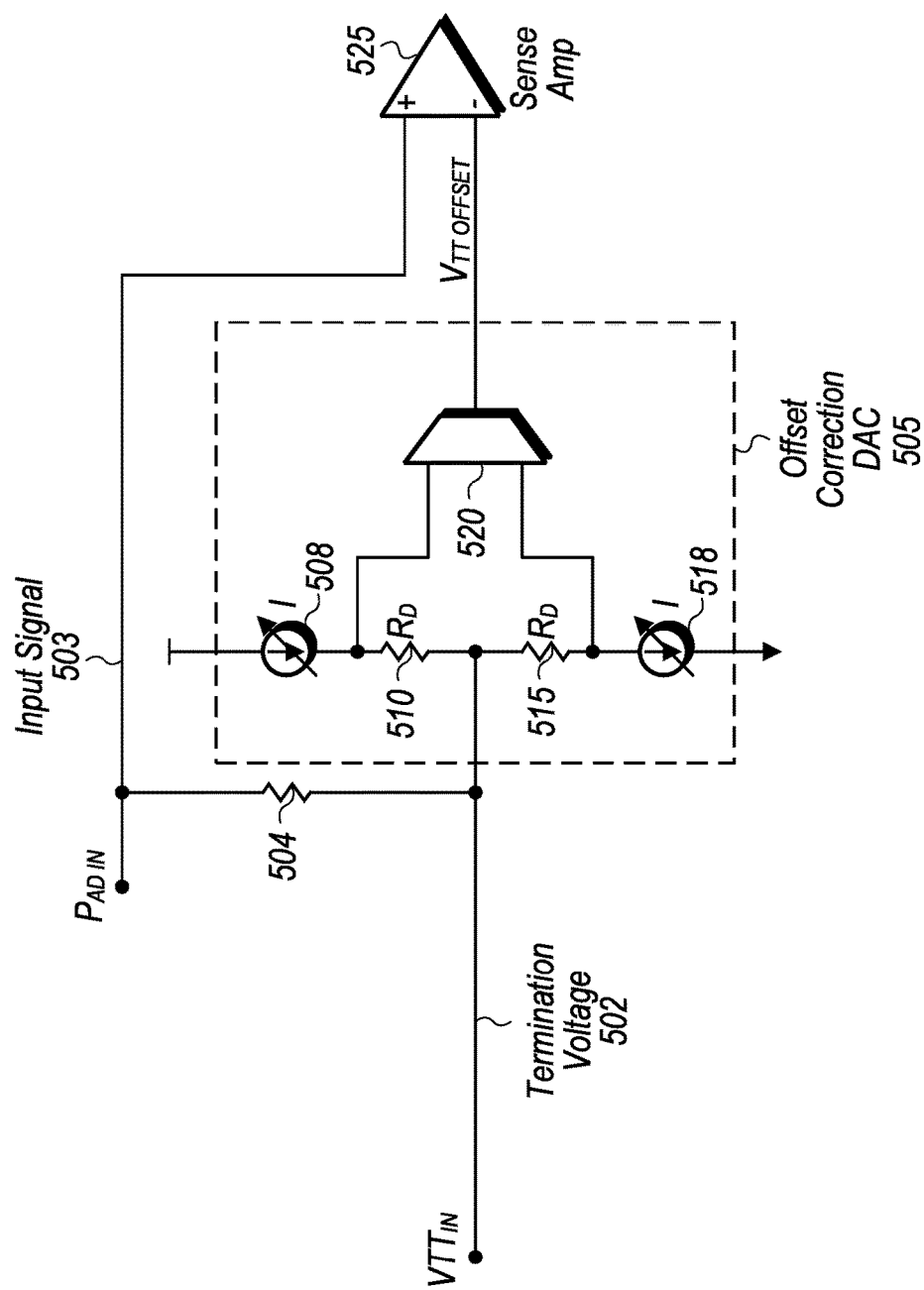
FIG. 5 is a diagram of one implementation of a circuit for applying an offset to a termination voltage.

Referring now to FIG. 3, a generalized block diagram of one implementation of a communication bus 300 is shown. As shown, communication bus 300 includes transmitters 310-324 for sending information as electrical signals, transmission lines 350-364 for transferring the electrical signals, and receivers 330-344 for receiving the electrical signals. Additionally, communication bus 300 includes a termination voltage (VTT) generator 370 for generating termination voltage (VTT) 372. Termination voltage (VTT) 372 can also be referred to herein as a "reference voltage". As shown, VTT 372 is sent to each of the receivers 330-344. In the illustrated implementation, receiver 344 couples VTT 372 to each of termination circuitry 380 and sampling circuitry 382. In various implementations, one or more of the receivers 330-344 applies an offset to VTT 372 prior to coupling VTT 372 to the sampling circuitry. In one implementation, one or more of the receivers 330-344 includes an offset correction circuit to apply an offset voltage to VTT 372. One example of an offset correction circuit is shown in FIG. 5.

It is noted that the term "bus" can also be referred to as a "channel," and each "transmission line" can also be referred to as a "lane" or a "trace" or a "wire." In various implementations, transmission lines 350-364 are constructed from a variety of suitable metal sources during semiconductor fabrication and surrounded by a variety of any suitable insulating material. It is also noted that the terms "pin," "port," "terminal," and "node" are used interchangeably herein. Although eight transmitters 310-324, eight transmission lines 350-364 and eight receivers 330-344 are shown, in other implementations, any number of these components are used.

In some implementations, the signals sent from transmitters 310-324 to receivers 330-344 are single-ended data signals. The term "single-ended signal" is defined as an electrical signal which is transmitted using a single signal conductor. For example, in an implementation, receiver 330 receives a single-ended signal from transmitter 310 via transmission line 350, which is a single signal conductor. In contrast to using single-ended data signals, sending information with differential data signals uses more lines and more pins. A reference signal is not generated and sent to multiple pins (or multiple receivers) when differential data signals are used. As is known in the art, differential signaling generally provides better noise immunity than single-ended signaling. However, the use of differential signaling comes at the added cost of extra pins and extra traces.

In order to better handle noise issues when using single-ended signaling, communication bus 300 uses VTT 372 in each of the signal termination circuitry 380 and the signal sampling circuitry 382. Any noise on one of the received input signals on transmission lines 350-364 and any noise on VTT 372 are tracked by each of the signal termination circuitry 380 and the signal sampling circuitry 382. In various implementations, a capacitance is used within VTT generator 370 to reduce noise on VTT 372 and keep VTT 372 as stable as possible. In some implementations, the capacitance used within VTT generator 370 is a lumped capacitance, whereas, in other implementations, this capacitance is a distributed capacitance. By limiting the noise on VTT 372 with this capacitance within VTT generator 370, the common mode noise received by samplers within the receivers 330-344 is also reduced.

As shown in FIG. 3, when cross coupling capacitance on transmission lines 350-364 (and additional external transmission lines, in some implementations) causes VTT 372 to change its value from its generated value, the change is received by each of the signal termination circuitry 380 and the signal sampling circuitry 382. For example, the signal sampling circuitry 382 receives a value generated by the signal termination circuitry 380 and compares it to a reference voltage, which is VTT 372. In one implementation, an offset voltage is applied to VTT 372 and then the offset-adjusted VTT 372 is provided to the signal sampling circuitry 382.

Figure 4:
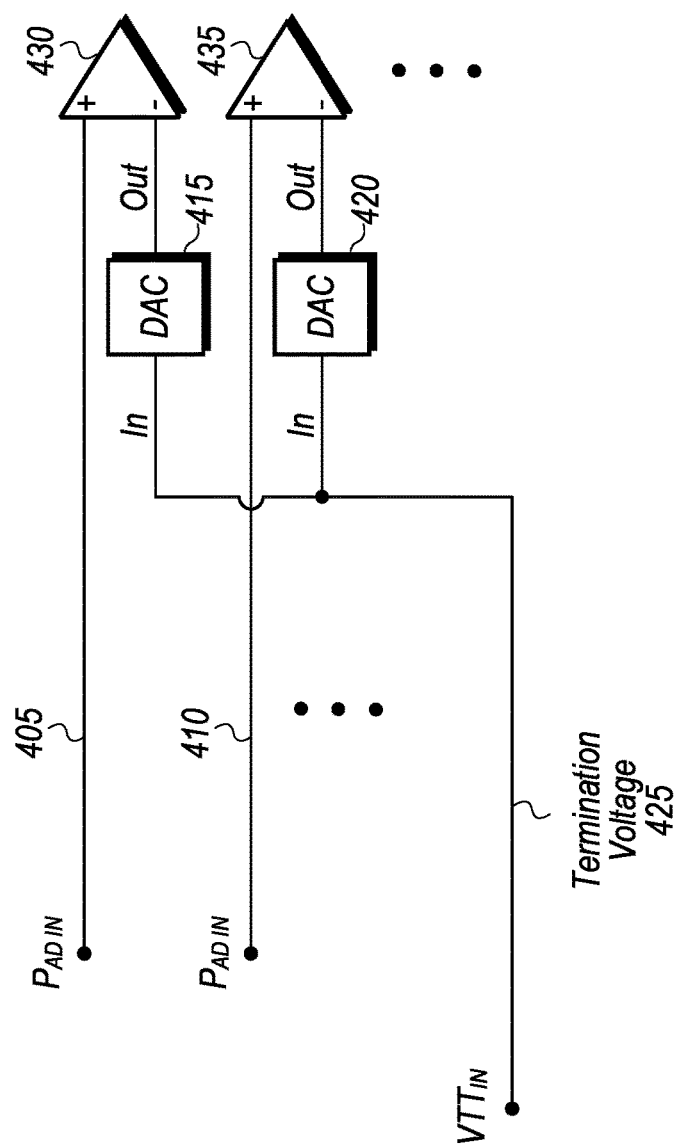
FIG. 4 is a diagram of one implementation of a circuit for applying a positive or negative offset to a termination voltage.

Turning now to FIG. 4, a diagram of one implementation of a circuit 400 for applying a positive or negative offset to a termination voltage is shown. Input signals 405 and 410 are received by circuit 400 and coupled to the positive input nodes of sense amplifiers 430 and 435, respectively. Input signals 405 and 410 are representative of any number of input signals that are received by circuit 400. Termination voltage 425 is coupled to the inputs of digital to analog converters (DAC) 415 and 420. Each DAC 415 and 420 applies a positive or negative offset to termination voltage 425 and then the outputs of DACs 415 and 420 are coupled to the negative inputs of sense amplifiers 430 and 435. The output of sense amplifier 430 is generated based on a comparison of input signal 405 and the output of DAC 415. Similarly, the output of sense amplifier 435 is generated based on a comparison of input signal 410 and the output of DAC 420.

Referring now to FIG. 5, a diagram of one implementation of a circuit 500 for applying an offset to a termination voltage is shown. Circuit 500 includes offset correction DAC 505 and sense amplifier 525. In one implementation, the circuitry of offset correction DAC 505 is included in DACs 420 and 425 (of FIG. 4). Offset correction DAC 505 generates a positive or negative offset voltage that is referenced to VTT 502. Either the positive or negative offset voltage with respect to VTT 502 is coupled to the negative input terminal of sense amplifier 525.

In one implementation, an input signal 503 is received by circuit 500 and coupled to one end of resistor 504. The input signal 503 is also coupled to the positive terminal of sense amplifier 525. A termination voltage 502 (i.e., VTT 502) is received by circuit 500 and coupled to the midpoint of resistors 510 and 515. The resistance $R_D$ of resistors 510 and 515 is fixed or variable depending on the implementation. The termination voltage 502 is also coupled to the other end of resistor 504. In one implementation, resistor 504 is an on-die termination (ODT) resistor.

The current sources 508 and 518 create the current that flows through resistors 510 and 515, respectively. The current flowing through resistors 510 and 515 creates the offset voltage with respect to termination voltage 502. A positive offset voltage with respect to termination voltage 502 is generated at the top end of resistor 510, and this positive offset voltage is coupled to a first input of multiplexer 520. A negative offset voltage with respect to termination voltage 502 is generated at the bottom end of resistor 515, and this negative offset voltage is coupled to a second input of multiplexer 520. A select signal (not shown) determines which offset voltage, negative or positive, is coupled through to the negative input of sense amplifier 525. In one implementation, a most significant bit (MSB) of the DAC 505 code is the sign bit that determines which input of multiplexer 520 is passed through to the negative input of sense amplifier 525.

In one implementation, the current generated by current sources 508 and 518 is matched. Accordingly, since the current through resistor 510 equals the current through resistor 515, there is no current flowing into the generator of termination voltage 502. It is noted that the VTT offset voltage is equal to VTT+/−I*$R_D$ for offset correction. The offset voltage tracks VTT resulting in noise tracking being maintained while an independent correction is applied to sense amplifier 525. As the current flowing through resistors 510 and 515 increases, the offset voltage likewise increases. Accordingly, offset correction DAC 505 controls the positive and negative offset voltages applied to VTT 502 by changing the amount of current generated by current sources 508 and 518. In one implementation, offset correction DAC 505 adjusts a magnitude of the current driven through resistors 505 and 510 based on the results of a calibration sequence.

Figure 6:
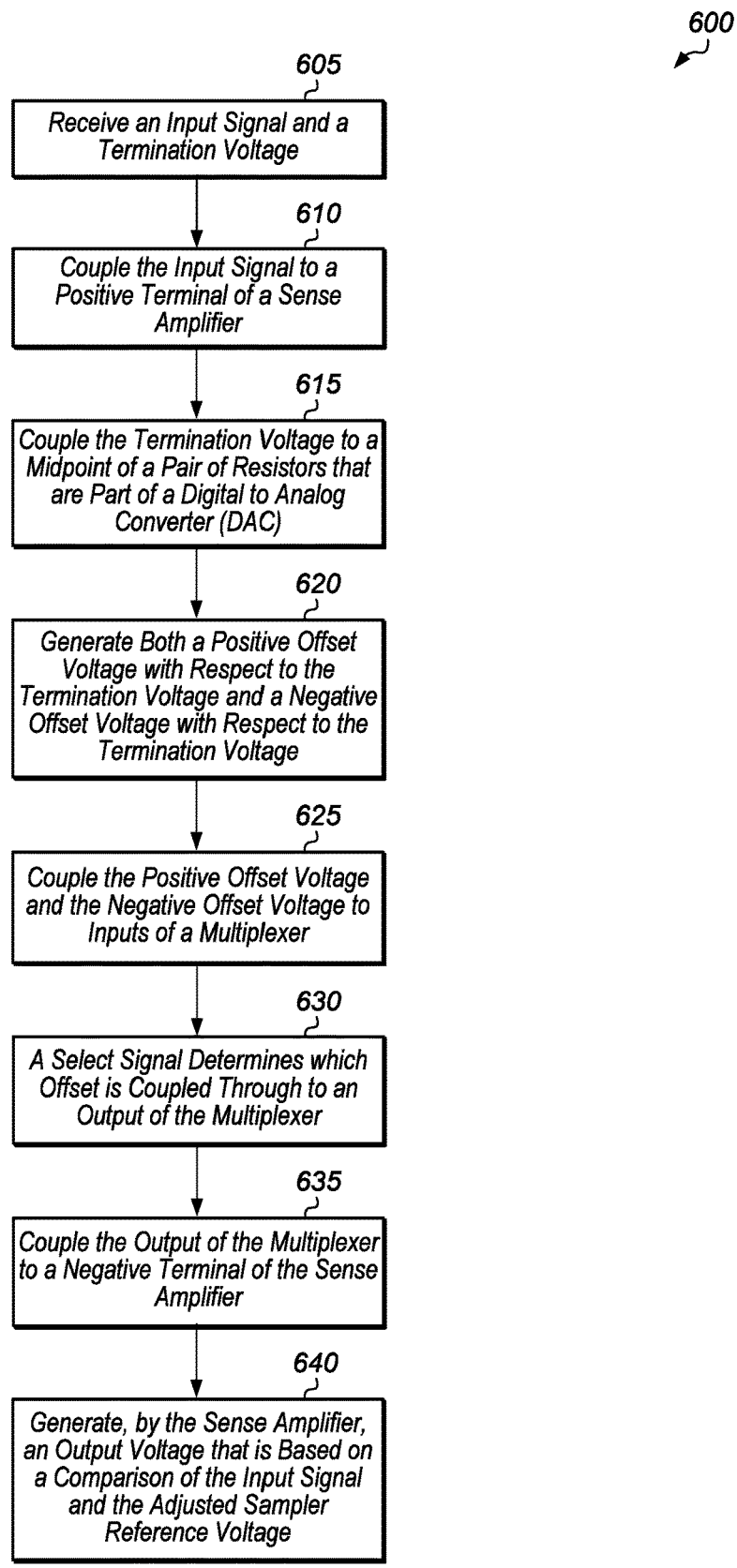
FIG. 6 is a generalized flow diagram illustrating one implementation of a method for implementing an offset correction technique for use with pseudo differential signaling.
Figure 7:
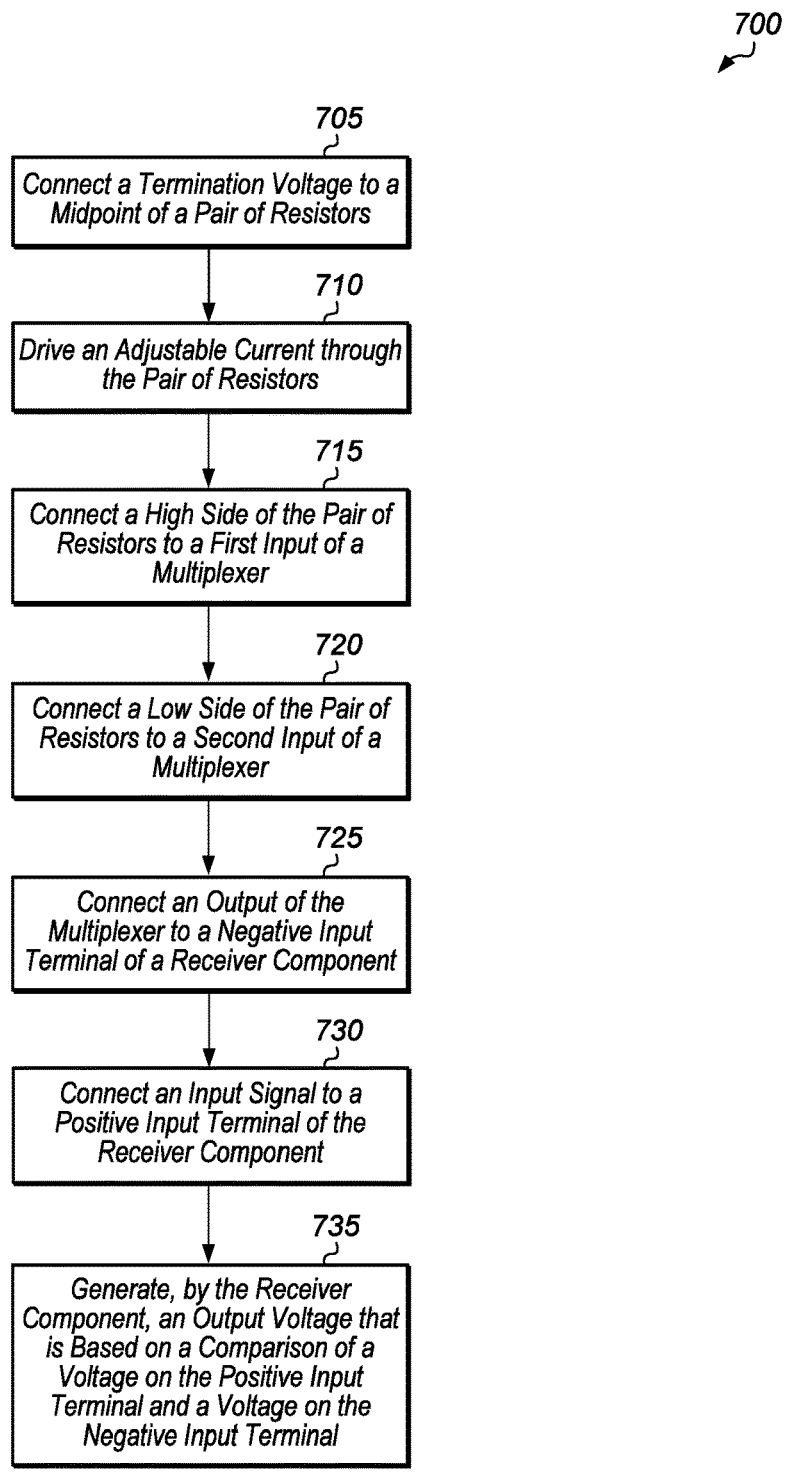
FIG. 7 is a generalized flow diagram illustrating one implementation of a method for applying an offset correction to a termination voltage.

Turning now to FIG. 6, one implementation of a method 600 for implementing an offset correction technique for use with pseudo differential signaling is shown. For purposes of discussion, the steps in this implementation and those of FIG. 7 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 600.

A circuit receives an input signal and a termination voltage (block 605). The circuit couples the input signal to a positive terminal of a sense amplifier (block 610). The circuit couples the termination voltage to a midpoint of a pair of resistors that are part of a digital to analog converter (DAC) (block 615). The DAC generates both a positive offset voltage with respect to the termination voltage and a negative offset voltage with respect to the termination voltage (block 620). The DAC couples the positive offset voltage with respect to the termination voltage and the negative offset voltage with respect to the termination voltage to inputs of a multiplexer (block 625). A select signal determines which offset is coupled through to an output of the multiplexer (block 630). The output of the multiplexer is coupled to a negative terminal of the sense amplifier (block 635). The sense amplifier generates an output voltage that is based on a comparison of the input signal and the adjusted sampler reference voltage (i.e., VTT+/−offset) (block 640). After block 640, method 600 ends.

Referring now to FIG. 7, one implementation of a method 700 for applying an offset correction to a termination voltage is shown. A termination voltage is connected to a midpoint of a pair of resistors (block 705). In one implementation, each resistor of the pair has the same resistance. An adjustable current is driven through the pair of resistors (block 710). A high-side of the pair of resistors is connected to a first input of a multiplexer (block 715). A low-side of the pair of resistors is connected to a second input of the multiplexer (block 720). An output of the multiplexer is connected to a negative input terminal of a receiver component (block 725). In one implementation, the receiver component is a sense amplifier. In other implementations, the receiver component is any of various other types of components (e.g., analog to digital converter). An input signal is connected to a positive input terminal of the receiver component (block 730). The receiver component generates an output voltage based on a comparison of a voltage on the positive input terminal and a voltage on the negative input terminal (block 735). After block 735, method 700 ends.

In various implementations, program instructions of a software application are used to implement the methods and/or mechanisms described herein. For example, program instructions executable by a general or special purpose processor are contemplated. In various implementations, such program instructions are represented by a high level programming language. In other implementations, the program instructions are compiled from a high level programming language to a binary, intermediate, or other form. Alternatively, program instructions are written that describe the behavior or design of hardware. Such program instructions are represented by a high-level programming language, such as C. Alternatively, a hardware design language (HDL) such as Verilog is used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
an offset correction circuit; and
a receiver component, wherein the receiver component receives an input signal on a positive input terminal;
wherein the offset correction circuit is configured to:
apply a positive offset voltage to a termination voltage that is coupled to a midpoint between a pair of resistors;
apply a negative offset voltage to the termination voltage; and
connect either the positive offset voltage applied to the termination voltage or the negative offset voltage applied to the termination voltage to a negative input terminal of the receiver component;
wherein the receiver component is configured to generate an output voltage based on a comparison between the positive input terminal and the negative input terminal.

2. The system as recited in claim 1, wherein the positive offset voltage applied to the termination voltage is generated on a top side of a first resistor of the pair of resistors.

3. The system as recited in claim 2, wherein the negative offset voltage applied to the termination voltage is generated on a bottom side of a second resistor of the pair of resistors.

4. The system as recited in claim 3, wherein the offset correction circuit is configured to drive a current through the pair of resistors.

5. The system as recited in claim 4, wherein the offset correction circuit comprises a digital to analog converter (DAC) configured to adjust a magnitude of the current driven through the pair of resistors based on a calibration sequence.

6. The system as recited in claim 1, wherein:
the positive offset voltage applied to the termination voltage is coupled to a first input of a multiplexer;
the negative offset voltage applied to the termination voltage is coupled to a second input of the multiplexer;
an output of the multiplexer is coupled to the negative input terminal of the receiver component; and
the receiver component is a sense amplifier.

7. A method comprising:
receiving an input signal on a positive input terminal of a receiver component;
applying a positive offset voltage to a termination voltage that is coupled to a midpoint between a pair of resistors;
applying a negative offset voltage to the termination voltage;
connecting either the positive offset voltage applied to the termination voltage or the negative offset voltage applied to the termination voltage to a negative input terminal of the receiver component; and
generating, by the receiver component, an output voltage based on a comparison between to the positive input terminal and the negative input terminal.

8. The method as recited in claim 7, wherein the positive offset voltage applied to the termination voltage is generated on a top side of a first resistor of the pair of resistors.

9. The method as recited in claim 8, wherein the negative offset voltage applied to the termination voltage is generated on a bottom side of a second resistor of the pair of resistors.

10. The method as recited in claim 9, further comprising driving a current through the pair of resistors.

11. The method as recited in claim 10, further comprising a digital to analog converter (DAC) adjusting a magnitude of the current driven through the pair of resistors based on a calibration sequence.

12. The method as recited in claim 7, further comprising:
coupling the positive offset voltage applied to the termination voltage to a first input of a multiplexer;
coupling the negative offset voltage applied to the termination voltage is coupled to a second input of the multiplexer; and
coupling an output of the multiplexer to the negative input terminal of the receiver component, wherein the receiver component is a sense amplifier.

13. A circuit comprising:
a digital to analog converter (DAC); and
a receiver component which receives an input signal on a positive input terminal;
wherein the DAC is configured to:
apply a positive offset voltage to a termination voltage that is coupled to a midpoint between a pair of resistors;
apply a negative offset voltage to the termination voltage; and
connect either the positive offset voltage applied to the termination voltage or the negative offset voltage applied to the termination voltage to a negative input terminal of the receiver component;
wherein the receiver component is configured to generate an output voltage based on a comparison between the positive input terminal and the negative input terminal.

14. The circuit as recited in claim 13, wherein the positive offset voltage applied to the termination voltage is generated on a top side of a first resistor of the pair of resistors.

15. The circuit as recited in claim 14, wherein the negative offset voltage applied to the termination voltage is generated on a bottom side of a second resistor of the pair of resistors.

16. The circuit as recited in claim 15, wherein the DAC is configured to drive a current through the pair of resistors.

17. The circuit as recited in claim 16, wherein the DAC is configured to adjust a magnitude of the current driven through the pair of resistors based on a calibration sequence.

* * * * *